(12) United States Patent
Peterman

(10) Patent No.: US 7,735,419 B2
(45) Date of Patent: Jun. 15, 2010

(54) SYSTEM FOR SOFT LITHOGRAPHY

(75) Inventor: Mark C. Peterman, Jackson, WY (US)

(73) Assignee: Labrador Research, LLC, Fremont, CA (US)

( * ) Notice: Subject to any disclaimer, the term of this patent is extended or adjusted under 35 U.S.C. 154(b) by 612 days.

(21) Appl. No.: 11/600,947

(22) Filed: Nov. 16, 2006

(65) Prior Publication Data

US 2008/0115683 A1    May 22, 2008

(51) Int. Cl.
 *B41G 7/00* (2006.01)
(52) U.S. Cl. .................. 101/368; 101/327; 101/486
(58) Field of Classification Search .................. 101/41, 101/327, 368, 485, 486; 356/139.04, 121, 356/614, 620, 622, 399–401
See application file for complete search history.

(56) References Cited

U.S. PATENT DOCUMENTS

| | | | | | |
|---|---|---|---|---|---|
| 3,463,476 | A | * | 8/1969 | Bentzinger et al. | ............ 269/21 |
| 5,368,645 | A | * | 11/1994 | Bok | ............ 118/500 |
| 5,937,758 | A | * | 8/1999 | Maracas et al. | ............ 101/327 |
| 6,656,308 | B2 | | 12/2003 | Hougham et al. | |
| 7,117,790 | B2 | | 10/2006 | Kendale et al. | |
| 2004/0011231 | A1 | * | 1/2004 | Hall et al. | ............ 101/327 |
| 2004/0058067 | A1 | * | 3/2004 | Law et al. | ............ 427/240 |
| 2004/0107704 | A1 | * | 6/2004 | Hudson et al. | ............ 62/3.3 |
| 2006/0130692 | A1 | * | 6/2006 | Peterman et al. | ............ 101/485 |

* cited by examiner

*Primary Examiner*—Ren Yan
(74) *Attorney, Agent, or Firm*—NUPAT, LLC; Morrison Ulman

(57) ABSTRACT

A transfer sheet placed between a vacuum chuck and a stamp in a soft lithography aligner facilitates three dimensional manufacturing with elastomeric materials.

10 Claims, 5 Drawing Sheets

SYSTEM FOR SOFT LITHOGRAPHY

GOVERNMENT RIGHTS

This invention was made with U.S. Government support under contract 5 R43 EY15029-02 awarded by the National Eye Institute/National Institutes of Health. The Government has certain rights in this invention.

RELATED APPLICATIONS

This application is related to U.S. patent application Ser. No. 10/905,210 filed on Dec. 21, 2004.

TECHNICAL FIELD

The disclosure is generally related to microfabrication processes and apparatus. In particular it is related to soft lithography alignment systems.

BACKGROUND

Lithography or printing refers to any number of processes for creating a permanent image on a substrate. In semiconductor and micro-electromechanical systems (MEMS) manufacturing, photolithography is widely used as a method of patterning substrates. Recently, however, "soft lithography" methods have become popular, especially in prototyping applications.

Soft lithography is analogous to rubber stamping, but with greater pattern resolution, accuracy and image quality. Soft lithography also encompasses three-dimensional manufacturing processes in which a stamp with grooves or other surface indentations is brought into contact with a substrate and permanently stuck to it.

Compared to photolithography, soft lithography is inexpensive and straightforward. The utility of soft lithography has been somewhat limited, however, by a lack of readily available alignment tools. Often a stamp and substrate are only aligned by unaided human visual inspection.

There is a need therefore for alignment tools that are appropriate for soft lithography and three-dimensional manufacturing.

BRIEF DESCRIPTION OF THE DRAWINGS

The drawings are heuristic for clarity.

DETAILED DESCRIPTION

Soft lithography refers generally to techniques for transferring precise two-dimensional patterns from a stamp to a substrate. The stamp is made from a polymer such as (poly) dimethylsiloxane (PDMS) or other elastomeric material. Despite the term "soft", there is no specific requirement on the hardness or softness of a material that affects its suitability for use in soft lithography. Other terms such as microcontact printing and microtransfer molding are encompassed within soft lithography. An inked stamp may be brought in contact with a surface to print patterns on the surface. Using appropriate master molds, stamp materials, and inks, submicron features may be printed.

In this patent application, soft lithography also refers to manufacturing methods in which three dimensional structures are created by joining together an elastomeric stamp with a substrate. The substrate may itself be an elastomeric sheet or a solid material. For example, when a stamp with grooves in its surface is stuck to a substrate, the grooves are sealed by the substrate and form three dimensional channels. More complicated three dimensional structures may be made by building up several stamp layers.

For both printing and three dimensional manufacturing applications it is useful to align a stamp with a substrate. Both stamps and substrates may incorporate alignment features or marks to aid with alignment. A human or robotic operator aligns the features by inspection through one or more microscopes before bringing the stamp in contact with the substrate.

PDMS has proven to be a popular stamp material for soft lithography. Conveniently, it is transparent which facilitates alignment by inspection of alignment marks. However, all of the apparatus and processes described herein are equally applicable to soft lithography using an opaque elastomeric stamp material using back side alignment techniques.

Figure 1A:
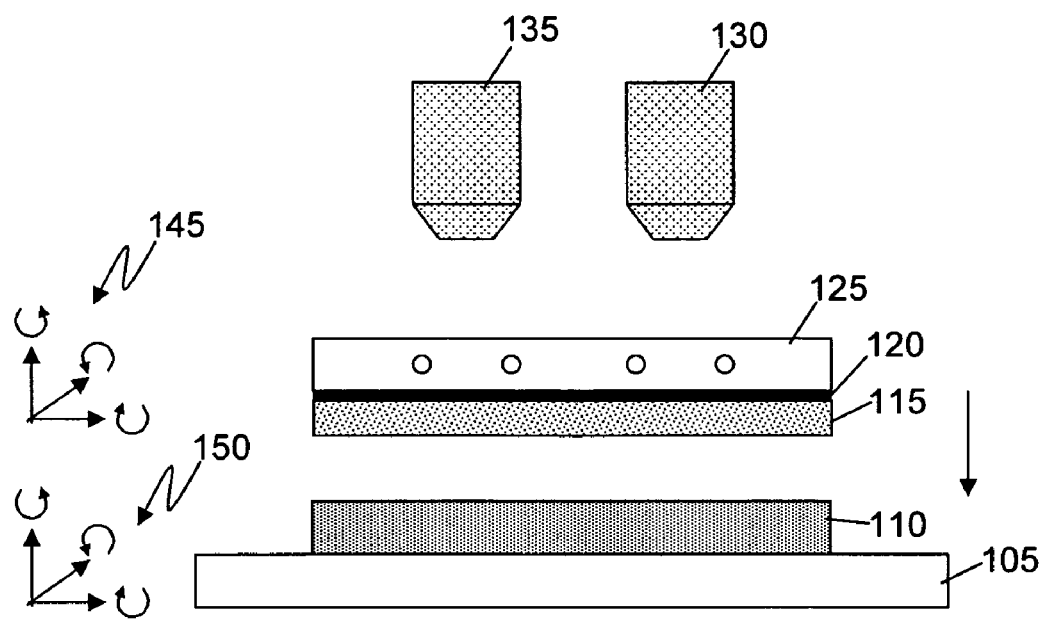
FIG. 1A shows elements of a soft lithography aligner system.

FIG. 1A shows elements of a soft lithography aligner system. The drawings are schematic only and many engineering details are omitted. In FIG. 1A substrate support 105 supports substrate 110. Substrate support 105 is made from a solid material, e.g. aluminum, and is mounted on a translation and rotation stage (not shown) that can move the support through as many as six degrees of freedom as suggested by axes 150. Substrate 110 may be a solid material or a semi-rigid material such as an elastomer. Elastomeric stamp 115 is in contact with transfer sheet 120 which is in turn in contact with vacuum chuck 125. Chuck 125 (and therefore transfer sheet 120 and stamp 115) are mounted on a translation and rotation stage (not shown) that can move the chuck through as many as six degrees of freedom as suggested by axes 145. Chuck 125 holds transfer sheet 120 through suction as described further below while transfer sheet 120 sticks to stamp 115 because of the surface properties of the sheet and stamp materials.

Chuck 125 and support 105 can be translated and rotated with respect to one another so that stamp 115 and substrate 110 can be brought into alignment. Microscopes 130 and 135 allow a human or robotic operator to view alignment marks on stamp 115 and substrate 110 while performing alignment adjustments to translation and rotation stages in the system. Alignment is performed with stamp 115 and substrate 110 slightly separated from one another. When alignment is complete stamp 115 is brought into contact with substrate 110.

Figure 1B:
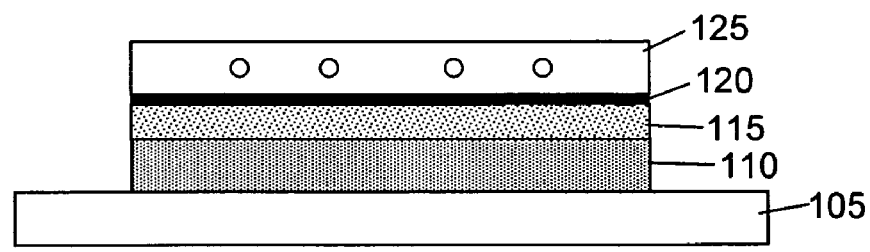
FIG. 1B shows the soft lithography aligner system of FIG. 1A with the stamp in contact with the substrate.

FIG. 1B shows the soft lithography aligner system of FIG. 1A with the stamp in contact with the substrate. (Microscopes 130 and 135 are not shown.) At this point ink on the surface of stamp 115 may be transferred to substrate 110 or stamp 115 may bond with substrate 110 to form a three dimensional structure. In the case of three dimensional manufacturing it is now necessary to release stamp 115 from chuck 125 so that the aligner can work with other pieces of stamp material. For printing, stamp 115 can be brought into contact with different substrates until ink on the surface of stamp 115 runs dry.

Elastomeric stamps, such as PDMS, are sticky. Therefore, while it is easy to apply a stamp directly to a chuck, such as vacuum chuck 125, it is more difficult to remove the stamp from the chuck especially if careful alignment and bonding of stamp and substrate materials is to be maintained. Transfer sheet 120 solves this problem. Transfer sheet 120 is made from a thin, flexible material such as MYLAR (polyester), acetate, polyvinyl chloride, polyethylene, or TEFLON (polytetrafluoroethylene). Properties of the transfer sheet include:

It can be tightly gripped and yet easily released by vacuum chuck 125. This property is met by materials that are smooth.

It can be easily peeled from a sticky elastomeric surface. This property is met by materials that are flexible.

Put another way, the transfer sheet must peel away from a sticky elastomeric surface with much less force than is required to peel an elastomeric stamp away from a substrate. At the same time the transfer sheet must stick to the stamp with enough force to hold it in place during alignment operations.

Figure 2A:
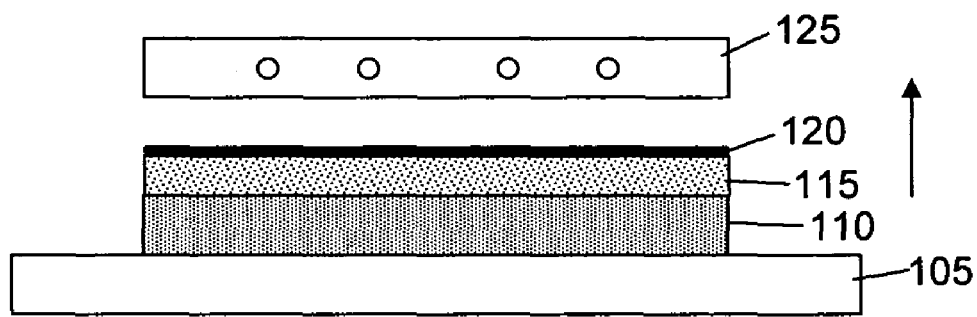
FIG. 2A shows the soft lithography aligner system of FIG. 1B after the vacuum chuck has released the stamp.

FIG. 2A shows the soft lithography aligner system of FIG. 1B after the vacuum chuck has released the stamp. The operator of the soft lithography aligner system is free at this point to pick up another stamp with chuck 125. Substrate 110, stamp 115 and transfer sheet 120 remain bonded together in a sandwich structure.

Figure 2B:
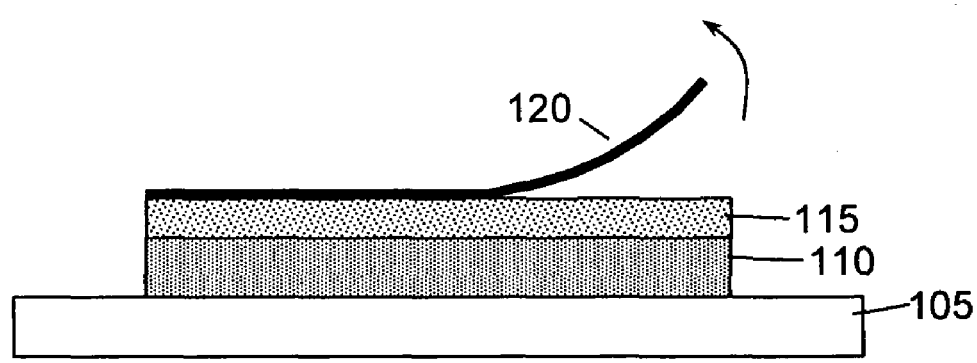
FIG. 2B shows the soft lithography aligner system of FIG. 2A while the transfer sheet is peeled away from the stamp.

FIG. 2B shows the soft lithography aligner system of FIG. 2A while the transfer sheet is peeled away from the stamp. During this operation stamp 115 remains aligned and bonded to substrate 110. Transfer sheet 120 makes three dimensional manufacturing with aligned elastomeric layers a robust and repeatable process.

In both printing and three dimensional manufacturing applications best results are achieved with careful control of the initial contact between stamp and substrate; i.e. the transition from the situation illustrated in FIG. 1A to that illustrated in FIG. 1B.

Figure 3:
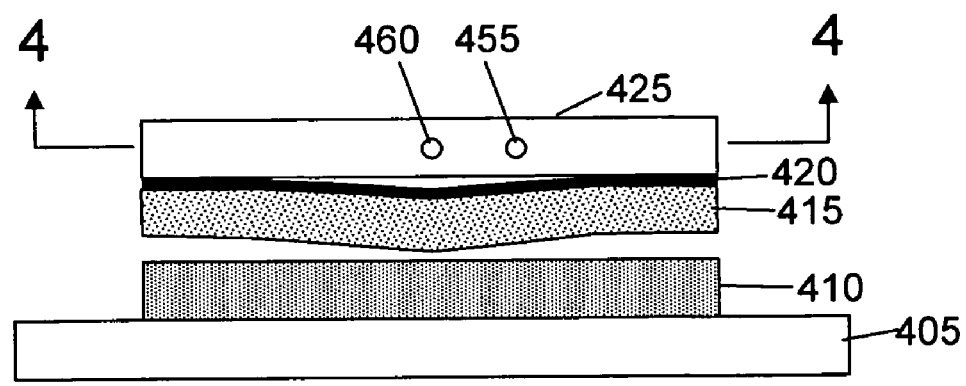
FIG. 3 shows a soft lithography aligner system in which a stamp is released from its center prior to release of the periphery.
Figure 4:
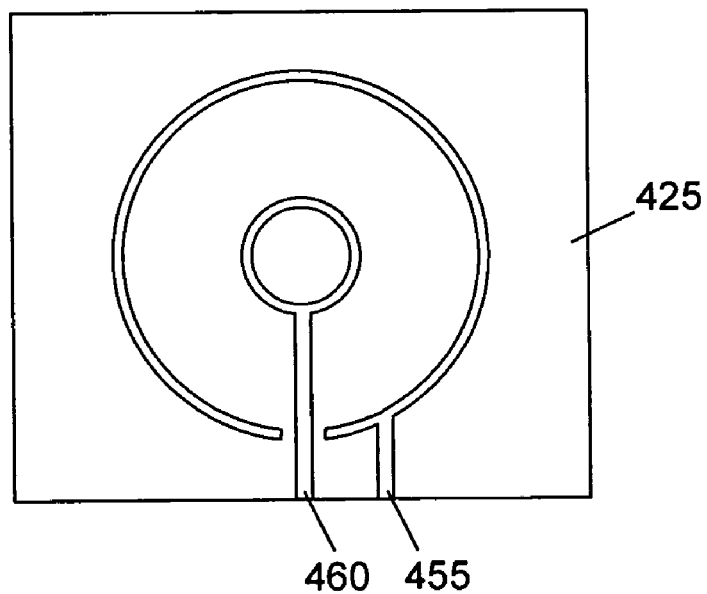
FIG. 4 shows a view of the vacuum chuck used in the system of FIG. 3.

FIG. 3 shows a soft lithography aligner system in which a stamp is released from its center prior to release of the periphery. In analogy with FIGS. 1A, 1B, 2A and 2B, in FIG. 3 vacuum chuck 425 holds transfer sheet 420 which is in contact with stamp 415. Substrate support 405 holds substrate 410. Holes 455 and 460 in vacuum chuck 425 lead to concentric vacuum grooves as seen in FIG. 4. Hole 455 leads to a groove near the periphery of chuck 425 while hold 460 leads to a groove near the center of chuck 425.

In FIG. 3 transfer sheet 420 and stamp 415 are sagging from the center of chuck 425 (sagging exaggerated). This state may be achieved by releasing the vacuum grip through hole 460 of chuck 425 while maintaining vacuum through hole 455. In this configuration, the center of stamp 415 will touch substrate 410 before the edge of the stamp touches the substrate when the stamp and substrate are brought into contact for printing or bonding. This arrangement reduces or eliminates the possibility of bubbles forming between stamp 415 and substrate 410. Although FIG. 4 shows concentric circular vacuum grooves in chuck 425 any kind of concentric arrangement would work if it allows the center of transfer sheet/stamp 420/415 to be released prior to the periphery.

Figure 5:
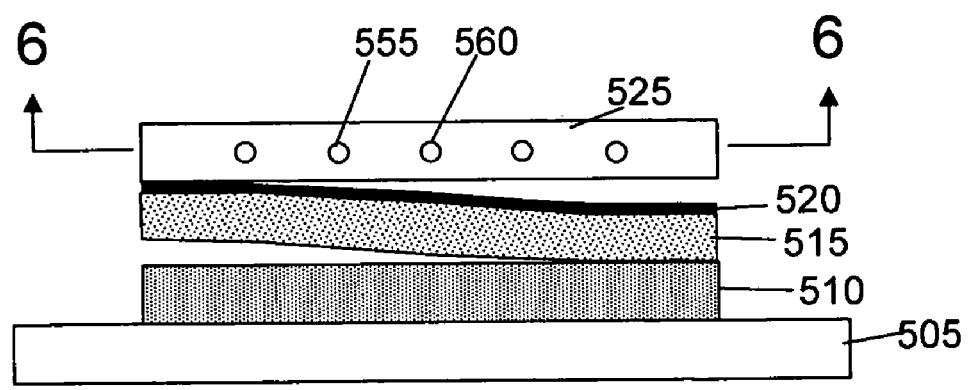
FIG. 5 shows a soft lithography aligner system in which a stamp is released from one edge toward another sequentially.

FIG. 5 shows a soft lithography aligner system in which a stamp is released from one edge toward another sequentially. In other words the chuck releases the stamp from one edge toward another. In analogy with FIG. 1A-FIG. 4, in FIG. 5 vacuum chuck 525 holds transfer sheet 520 which is in contact with stamp 515. Substrate support 505 holds substrate 510. Holes, such as 555 and 560, in vacuum chuck 425 lead to linear vacuum grooves as seen in FIG. 6.

In FIG. 5 transfer sheet 520 and stamp 515 are attached at one edge of chuck 525 while in contact with substrate 510 near the opposite edge. This state may be achieved by releasing the vacuum grip of chuck 525 sequentially. In this configuration, contact between the stamp and the substrate will start from one side of the stamp and proceed across the stamp to the opposite edge. This arrangement reduces or eliminates the possibility of bubbles forming between stamp 515 and substrate 510.

Figure 6:
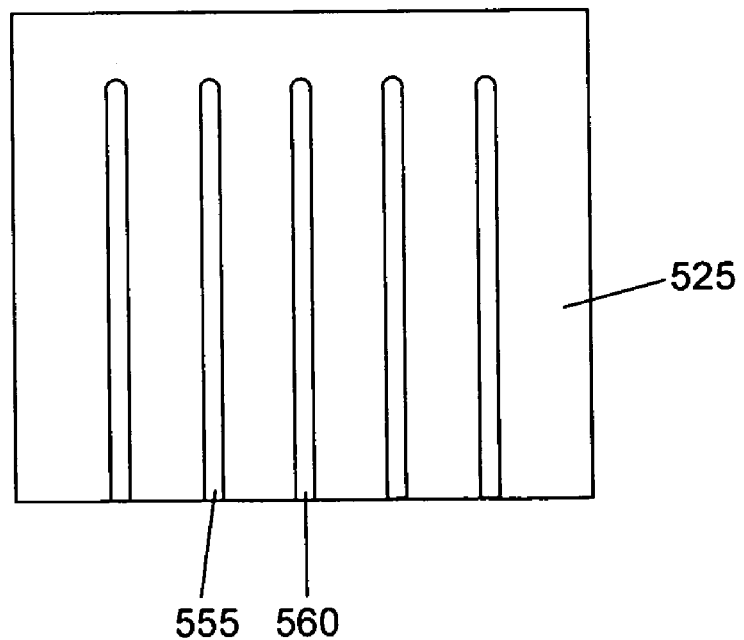
FIG. 6 shows a view of the vacuum chuck used in the system of FIG. 5.

FIG. 6 shows a view of the vacuum chuck used in the system of FIG. 5. A linear array of individually addressable vacuum grooves permits a stamp to be released in a linear progression, perpendicular to the long dimension of the grooves. Still other arrangements of vacuum holes and/or grooves are possible. For example, a vacuum chuck with a grid or two-dimensional array of holes could release a stamp in any sequence. The center-to-edge release of FIGS. 3 and 4, and the edge-to-edge release of FIGS. 5 and 6 both help prevent gas bubbles from becoming trapped between a stamp and a substrate when the two are brought into contact with one another.

Figure 7:
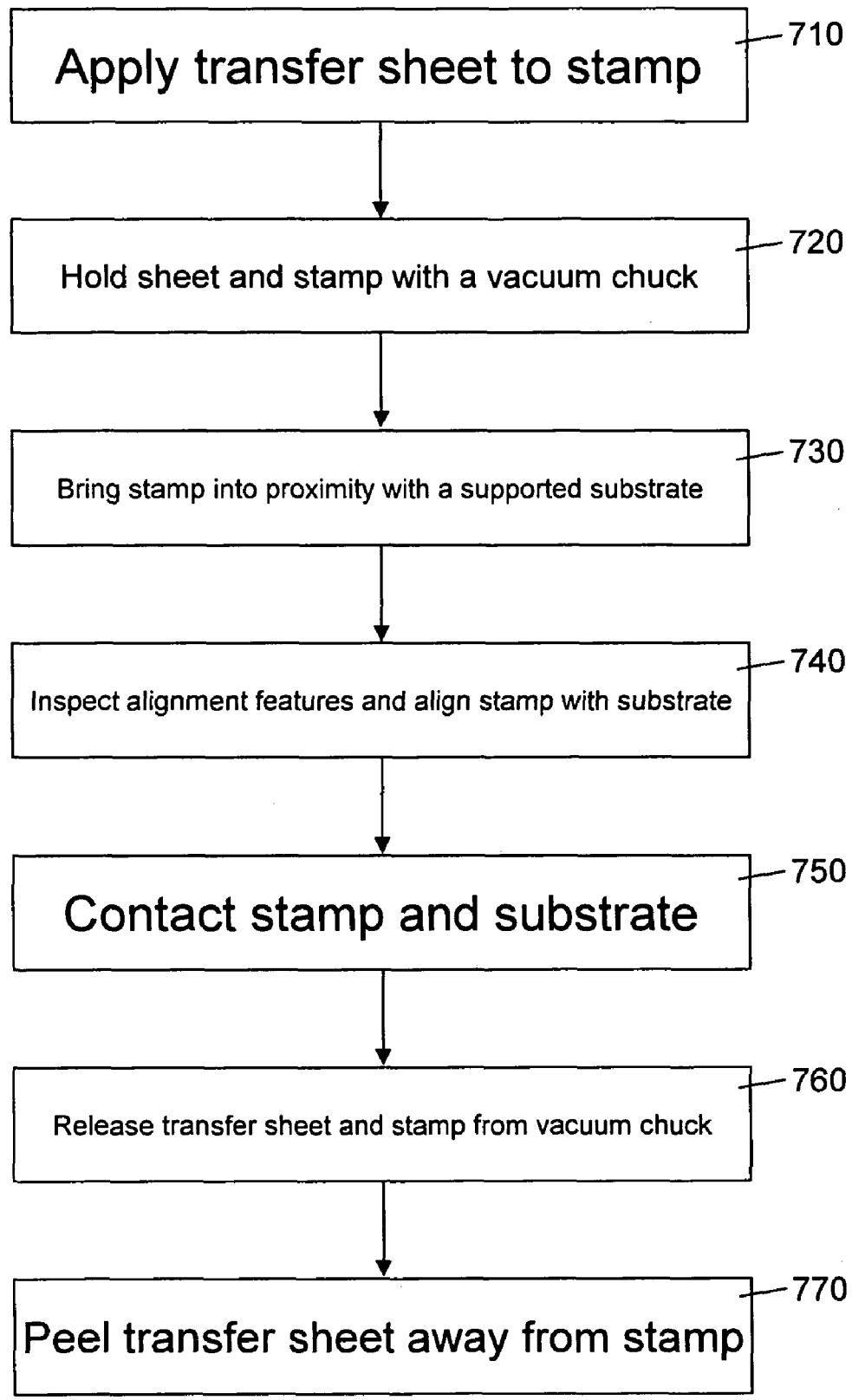
FIG. 7 is a flow chart for a soft lithography method.

FIG. 7 is a flow chart for a soft lithography method. The method requires an aligner system that comprises a flexible transfer sheet. The first step 710 in the method is applying a transfer sheet to a stamp. This may be accomplished manually. Next 720 the transfer sheet and stamp combination is held with a vacuum chuck. In step 730 the stamp is brought into proximity to a supported substrate. Alignment features on the stamp and substrate are inspected and the stamp and substrate are translated and rotated with respect to one another in step 740. The stamp and substrate are brought into contact with one another in step 750. The details of step 750, including the possibility of partially releasing the stamp from the chuck prior to all areas of the stamp contacting the substrate have been described in connection with FIGS. 1-6 above. The stamp and transfer sheet are released from the vacuum chuck in step 760. Finally, in step 770, the transfer sheet is peeled away from the stamp. The transfer sheet is made from a material, such as MYLAR that sticks to the stamp sufficiently for alignment operations, but may be peeled away without disturbing the bond between the stamp and the substrate after alignment is complete.

As an alternative to the embodiments described so far, a magnetic chuck may be substituted for vacuum chucks 125, 425, or 525. A magnetic chuck is suitable for use with a magnetic transfer sheet such as a magnetic metal foil. A magnetic chuck may also be used with any of the transfer sheets described earlier if the stamp to which the transfer sheet is applied is magnetic or contains a magnetic material. For example, a metal—PDMS composite stamp could contain magnetic regions. A magnetic chuck could be made with movable permanent magnets or with electromagnets. In either case, magnets in the chuck could be switched on or off to release a magnetic transfer sheet (or magnetic stamp) all at once or sequentially in analogy to the vacuum release schemes described in connection with FIGS. 3 and 5.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:

1. An aligner comprising:
A vacuum chuck for releasably holding a transfer sheet and an elastomeric stamp; a substrate support for holding a substrate to be contacted by said elastomeric stamp; and
said transfer sheet made of a polymer material; wherein,
the vacuum chuck and the substrate support can be translated and rotated with respect to one another,
the transfer sheet separates the vacuum chuck from said elastomeric stamp;
the transfer sheet is smooth such that it can be tightly gripped or easily released by the vacuum chuck, and,
the transfer sheet is thin and flexible such that it can be easily peeled from a sticky elastomeric surface of said elastomeric stamp using less force than is required to separate said stamp from the substrate.

2. The aligner of claim 1 further comprising a microscope for observing said stamp and a sample substrate.

3. The aligner of claim 1 wherein the vacuum chuck comprises concentric channels.

4. The aligner of claim 1 wherein the vacuum chuck comprises parallel channels.

5. The aligner of claim 1 wherein the transfer sheet is made of polyester.

6. The aligner of claim 1 wherein the transfer sheet is made of acetate.

7. The aligner of claim 1 wherein the transfer sheet is made of polyvinyl chloride.

8. The aligner of claim 1 wherein the transfer sheet is made of polyethylene.

9. The aligner of claim 1 wherein the transfer sheet is made of polytetrafluoroethylene.

10. An aligner comprising:
A magnetic chuck for releasably holding a transfer sheet and an elastomeric stamp;
a substrate support for holding a substrate to be contacted by said elastomeric stamp; and
said transfer sheet made of metal foil; wherein,
the magnetic chuck and the substrate support can be translated and rotated with respect to one another,
the transfer sheet separates the magnetic chuck from said elastomeric stamp;
the transfer sheet is smooth such that it can be tightly gripped or easily released by the magnetic chuck, and,
the transfer sheet is thin and flexible such that it can be easily peeled from a sticky elastomeric surface of said elastomeric stamp using less force than is required to separate said stamp from the substrate.

* * * * *